(12) United States Patent
Nam et al.

(10) Patent No.: US 8,759,853 B2
(45) Date of Patent: Jun. 24, 2014

(54) LIGHT EMITTING DEVICE

(75) Inventors: Seungkeun Nam, Seoul (KR); Junghun Jang, Seoul (KR); Jeongsik Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/366,786

(22) Filed: Feb. 6, 2012

(65) Prior Publication Data

US 2012/0138949 A1  Jun. 7, 2012

(30) Foreign Application Priority Data

Jun. 24, 2011  (KR) .................. 10-2011-0061569

(51) Int. Cl.
*H01L 33/00* (2010.01)

(52) U.S. Cl.
USPC .................. 257/96; 257/13; 257/E33.008

(58) Field of Classification Search
USPC .................. 257/76, 98, E33.023, 13, E33.008
See application file for complete search history.

(56) References Cited

U.S. PATENT DOCUMENTS

| | | | | |
|---|---|---|---|---|
| 6,841,800 B2* | 1/2005 | Oku et al. | ......................... | 257/94 |
| 7,462,505 B2* | 12/2008 | Lee et al. | ......................... | 438/47 |
| 7,598,108 B2* | 10/2009 | Li et al. | ............................ | 438/48 |
| 7,811,847 B2* | 10/2010 | Hirayama et al. | .............. | 438/46 |
| 8,093,625 B2* | 1/2012 | Shim | .............................. | 257/190 |
| 2003/0057434 A1* | 3/2003 | Hata et al. | ...................... | 257/103 |
| 2003/0132440 A1* | 7/2003 | Oku et al. | ......................... | 257/79 |
| 2004/0119063 A1* | 6/2004 | Guo et al. | ......................... | 257/13 |
| 2005/0121681 A1* | 6/2005 | Oku et al. | ......................... | 257/97 |
| 2007/0034883 A1* | 2/2007 | Ohba | .............................. | 257/85 |
| 2007/0069239 A1* | 3/2007 | Kosaki et al. | ................. | 257/189 |
| 2007/0197004 A1* | 8/2007 | Dadgar et al. | ................ | 438/479 |
| 2008/0203382 A1* | 8/2008 | Yanagihara | ..................... | 257/18 |
| 2009/0001409 A1* | 1/2009 | Takano et al. | ................. | 257/103 |
| 2009/0283028 A1* | 11/2009 | Schowalter et al. | ............. | 117/9 |
| 2010/0244040 A1* | 9/2010 | Yokoyama et al. | ............. | 257/76 |
| 2010/0258814 A1* | 10/2010 | Hoshi et al. | ..................... | 257/76 |
| 2011/0001127 A1* | 1/2011 | Sakamoto et al. | .............. | 257/22 |
| 2011/0220867 A1* | 9/2011 | Khan et al. | ...................... | 257/13 |
| 2012/0175589 A1* | 7/2012 | Ooshika et al. | ................. | 257/13 |

FOREIGN PATENT DOCUMENTS

WO  WO 2011024979 A1 *  3/2011

* cited by examiner

*Primary Examiner* — Cheung Lee
*Assistant Examiner* — Jeremy Joy
(74) *Attorney, Agent, or Firm* — Birch, Stewart, Kolasch & Birch, LLP

(57) ABSTRACT

Disclosed is a light emitting device including a substrate, a first buffer layer disposed on the substrate, the first buffer layer comprising aluminum nitride (AlN), an insertion layer disposed on the first buffer layer, the insertion layer comprising aluminum (Al), and a light emitting structure disposed on the insertion layer, the light emitting structure comprising a first semiconductor layer, a second semiconductor layer, and an active layer interposed between the first semiconductor layer and the second semiconductor layer.

12 Claims, 9 Drawing Sheets

LIGHT EMITTING DEVICE

CROSS-REFERENCE TO RELATED APPLICATION

This application claims the priority benefit of Korean Patent Application No. 10-2011-0061569, filed on Jun. 24, 2011 in the Korean Intellectual Property Office, the disclosure of which is incorporated herein by reference.

BACKGROUND

1. Field

Embodiments relate to a light emitting device.

2. Description of the Related Art

A light emitting diode (LED) is a device which converts electric signals into light using characteristics of compound semiconductors. LEDs are now being applied to devices such as home appliances, remote controls, electronic signboards, displays, a variety of automatic appliances and the like and their application range continues to expand.

Generally, a miniaturized LED is fabricated as a surface mount device such that it can be directly mounted to a printed circuit board (PCB). Accordingly, an LED lamp used as a display device is also developed in a surface mount device-type. Such a surface mount device may substitute for a conventional lamp and is used as lighting displays, character displays, image displays and the like, rendering various colors.

LED semiconductors are grown on a hetero-substrate made of sapphire, silicon carbide (SiC) or the like, having a hexagonal system structure by a process such as metal organic chemical vapor deposition (MOCVD) or molecular beam epitaxy (MBE).

When a semiconductor layer is formed on a support substrate, cracks, warpage or dislocation may occur in the semiconductor layer due to differences in lattice coefficient and coefficient of thermal expansion between the semiconductor layer and the substrate. Accordingly, there is a need to reduce stress caused by differences in lattice coefficient and coefficient of thermal expansion between the support substrate and the semiconductor layer.

SUMMARY

Embodiments provide a light emitting device in which the surface thereof is planarized by inserting an insertion layer containing aluminum (Al) into a buffer layer formed between a substrate and a light emitting structure.

In one embodiment, a light emitting device includes: a substrate, a first buffer disposed on the substrate, the first buffer including aluminum nitride (AlN), an insertion layer disposed on the first buffer layer, the insertion layer including Al, and a light emitting structure including a first conductive semiconductor layer, a second conductive semiconductor layer and an active layer disposed between the first and second semiconductor layers.

BRIEF DESCRIPTION OF THE DRAWINGS

Details of the embodiments will be more clearly understood from the following detailed description taken in conjunction with the accompanying drawings, in which.

DETAILED DESCRIPTION OF EMBODIMENTS

Figure 1:
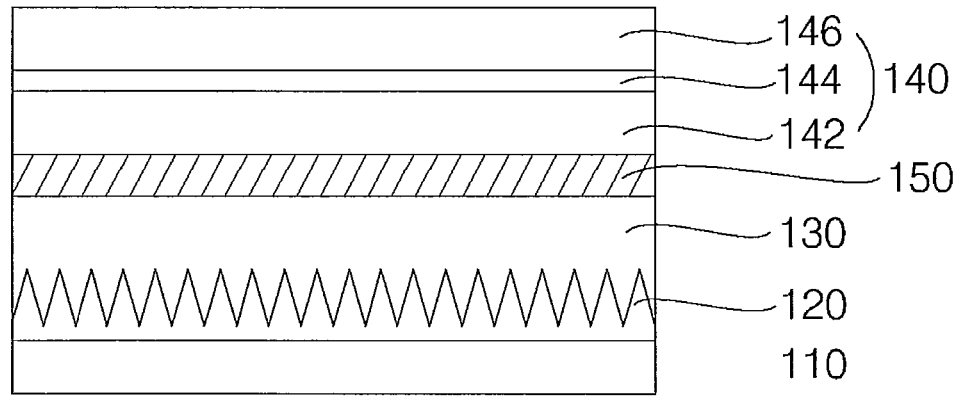
FIG. 1 is a sectional view illustrating the structure of a light emitting device according to one embodiment.

Reference will now be made in detail to the preferred embodiments, examples of which are illustrated in the accompanying drawings. Wherever possible, the same reference numbers will be used throughout the drawings to refer to the same or like parts.

Prior to description of the embodiments, it will be understood that when an element such as a layer (film), region, pattern, or structure is referred to as being formed "on" or "under" another element, such as a substrate, layer (film), region, pad, or pattern, it can be directly "on" or "under" the other element or be indirectly formed with intervening elements therebetween. Further, "on" or "under" of each layer will be described based on illustration in the drawings.

In the drawings, the thickness or size of each layer is exaggerated, omitted, or schematically illustrated for convenience of description and clarity. Also, the size or area of each constituent element does not entirely reflect the actual size thereof.

Hereinafter, embodiments will be described in more detail with reference to the annexed drawings.

FIG. 1 is a sectional view illustrating the structure of a light emitting device 100 according to one embodiment.

Referring to FIG. 1, the light emitting device according to this embodiment 100 includes a substrate 110, a first buffer layer 120 including aluminum nitride (AlN), disposed on the substrate 110, an insertion layer 130 that is disposed on the first buffer layer 120 and included aluminum (Al), and a light emitting structure 140 that is disposed on the insertion layer and includes a first conductive semiconductor layer 142, a second conductive semiconductor layer 146 and an active layer 144 disposed between the first semiconductor layer 142 and the second semiconductor layer 146.

The substrate 110 may support semiconductor structures. The substrate 110 enables semiconductor structures to be grown thereon. The substrate 110 may have light transparency. For example, when the substrate is formed to comprise silicon (Si) having a thickness less than a predetermined thickness, the substrate 110 may be transparent to light, without being limited thereto. The substrate 110 may be made of a material having superior thermal conductivity. Preferably, the substrate 110 has an index of refraction smaller than that of the first semiconductor layer 142.

The substrate 110 may be provided at the upper surface thereof with a patterned substrate (PSS) structure in order to improve light extraction efficiency, but is not limited thereto. The substrate 110 facilitates emission of the light emitting device 100 and improves thermal stability of the light emitting device 100. Since there is a difference between lattice coefficient in the substrate 110 and the light emitting structure 140, a buffer layer may be provided between the substrate and the light emitting structure 140.

The light emitting structure 140 may be disposed on the substrate 110.

The light emitting structure 140 may include a first semiconductor layer 142, an active layer 144 and a second semiconductor layer 146, and may have a structure in which the active layer 144 is interposed between the first semiconductor layer 142 and the second semiconductor layer 146.

The first conductive semiconductor layer 142 may be realized with an n-type semiconductor layer, and the n-type semiconductor layer may be selected from semiconductor materials having the formula of $In_xAl_yGa_{1-x-y}N$ ($0 \leq x \leq 1$, $0 \leq y \leq 1$, $0 \leq x+y \leq 1$), such as gallium nitride (GaN), aluminum nitride (AlN), aluminum gallium nitride (AlGaN), indium gallium nitride (InGaN), indium nitride (InN), InAlGaN, AlInN and the like, and may be doped with an n-type dopant such as silicon (Si), germanium (Ge), tin (Sn), selenium (Se) or tellurium (Te).

The active layer 144 may be disposed on the first semiconductor layer 142. The active layer 144 may have a mono- or multi-quantum well structure, a quantum wire structure, a quantum dot structure or the like using a compound semiconductor material composed of group III-V elements.

In the case where the active layer 144 has a quantum well structure, for example, it may have a mono- or multi-quantum well structure including a well layer having the formula of $In_xAl_yGa_{1-x-y}N$ ($0 \leq x \leq 1$, $0 \leq y \leq 1$, $0 \leq x+y \leq 1$) and a barrier layer having the formula of $In_aAl_bGa_{1-a-b}N$ ($0 \leq a \leq 1$, $0 \leq b \leq 1$, $0 \leq a+b \leq 1$). The well layer may be formed of a material having a smaller band gap than the barrier layer.

A conductive clad layer (not shown) may be disposed on and/or under the active layer 144. The conductive clad layer (not shown) may be formed of an AlGaN-based semiconductor, and may have a greater band gap than the active layer 144.

The second semiconductor layer 146 may comprise a group III-V compound semiconductor doped with a semiconductor material having a formula of $In_xAl_yGa_{1-x-y}N$ ($0 \leq x \leq 1$, $0 \leq y \leq 1$, $0 \leq x+y \leq 1$). When the second semiconductor layer 146 is a p-type semiconductor layer, the second conductive-type dopant may comprise Mg, Zn, Ca, Sr, Ba or the like as a p-type dopant.

The second semiconductor layer 146 may be disposed on the active layer 144. The second semiconductor layer 146 may be realized with a p-type semiconductor layer, and the p-type semiconductor layer may be selected from semiconductor materials having the formula of $In_xAl_yGa_{1-x-y}N$ ($0 \leq x \leq 1$, $0 \leq y \leq 1$, $0 \leq x+y \leq 1$), such as gallium nitride (GaN), aluminum nitride (AlN), aluminum gallium nitride (AlGaN), indium gallium nitride (InGaN), indium nitride (InN), InAlGaN, AlInN and the like, and may be doped with a p-type dopant such as magnesium (Mg), zinc (Zn), calcium (Ca), strontium (Sr), or barium (Ba).

Meanwhile, the first semiconductor layer 142, the active layer 144 and the second semiconductor layer 146 may be formed by a method such as metal organic chemical vapor deposition (MOCVD), chemical vapor deposition (CVD), plasma-enhanced chemical vapor deposition (PECVD), molecular beam epitaxy (MBE) and hydride vapor phase epitaxy (HYPE), without being limited thereto.

The doping concentration of conductive dopant in the first semiconductor layer 142 and the second semiconductor layer 146 in the light emitting structure 140 may be uniform or non-uniform. That is, the interlayer structure of a plurality of semiconductor layers may be varied and is not limited thereto.

Meanwhile, the light emitting structure 140 may include a third semiconductor layer (not shown) having a polarity opposite to the second semiconductor layer 146, disposed under the second semiconductor layer 146. In addition, in the light emitting structure 140, the first semiconductor layer 132 may be realized by a p-type semiconductor layer and the second conductive semiconductor layer 136 may be realized by an n-type semiconductor layer. Accordingly, the light emitting structure layer 140 may include at least one of N-P, P-N, N-P-N and P-N-P junction structures and is not limited thereto.

The lattice coefficient of the light emitting structure 140 may be different from that of the substrate 110. The difference in lattice coefficient between the light emitting structure 140 and the substrate 110 may cause dislocation of the light emitting structure 140, when the light emitting structure 140 contacts the substrate 110.

The light emitting structure 140 may comprise gallium (Ga). The light emitting structure 140 may cause a molecular diffusion phenomenon together with the substrate 110. The light emitting structure 140 may undergo meltback in which a melting point is dropped when gallium (Ga) present inside reacts with silicon (Si) diffused from the substrate 110. The meltback may cause a defect in which the surface of the light emitting structure 140 is broken.

The first buffer layer 120 may be disposed on the substrate 110. The first buffer layer 120 may be interposed between the light emitting structure 140 and the substrate 110. The first buffer layer 120 may be provided at the upper surface thereof with a roughness. The first buffer layer 120 may comprise aluminum nitride (AlN).

Roughness may be provided at the interface between the first buffer layer 120 and the insertion layer 130. The first buffer layer 120 may have a non-uniform thickness due to the difference in lattice coefficient between the substrate 110 and the first buffer layer 120. The first buffer layer 120 may be firmly bonded to the insertion layer 130 due to roughness between the first buffer layer 120 and the insertion layer 130. The first buffer layer 120 may be provided with roughness to increase an orientation angle of the light emitting device 100.

The first buffer layer 120 prevents molecular diffusion between the substrate 110 and the light emitting structure 140. The first buffer layer 120 can reduce detachment caused by the difference in lattice coefficient between the substrate 110 and the light emitting structure 140. The first buffer layer 120 can reduce meltback caused by molecular diffusion between the substrate 110 and the light emitting structure 140.

The insertion layer 130 may be disposed on the upper surface of the first buffer layer 120. The first buffer layer 120 may be provided together with the insertion layer 130 to separate the substrate 110 from the light emitting structure 140. The first buffer layer 120 may be provided together with the insertion layer 130 to block molecular diffusion between the substrate 110 and the light emitting structure 140.

The first buffer layer 120 may have a thickness of 30 to 50 nm. When the first buffer layer 120 has a thickness of 30 nm or less, diffusion of molecules can be considerably reduced and when the thickness is 50 nm or more, slimness of the light emitting device 100 is inhibited and light extraction efficiency can be reduced.

The insertion layer 130 may be disposed on the first buffer layer 120. The insertion layer 130 may be disposed under the light emitting structure 140. The insertion layer 130 may separate the first buffer layer 120 from the light emitting structure 140. The insertion layer 130 may be disposed on the roughness disposed on the first buffer layer 120. The insertion layer 130 may have an even upper surface. Since the upper surface of the insertion layer 130 is even, the distance from the upper surface of the insertion layer 130 to the lower surface of the first buffer layer 120 may be substantially uniform.

The insertion layer 130 may comprise aluminum (Al). In accordance with one embodiment, the insertion layer 130 may be made of aluminum gallium nitride (AlGaN). The insertion layer 130 may react with silicon (Si) of internal aluminum (Al) diffused into the substrate 110. The insertion layer 130 comprises aluminum (Al), thus preventing reaction between gallium nitride (GaN) of the light emitting structure 140 and silicon (Si) diffused into the substrate.

The insertion layer 130 can prevent molecular diffusion. The insertion layer 130 may help the first buffer layer 120 to prevent molecular diffusion. The insertion layer 130 can prevent defects of the light emitting structure 140 that may be caused by surface defects of the first buffer layer 120. The insertion layer 130 may not cause meltback, although aluminum (Al) present therein and silicon (Si) present in the substrate 110 are bonded to each other due to diffusion. The insertion layer 130 can prevent meltback since aluminum comprised therein has high reactivity and a short diffusion distance.

The insertion layer 130 may be formed under a high temperature atmosphere. The insertion layer 130 may be formed at 1,000 to 1200° C. When the insertion layer 130 is formed at a temperature of 1000° C. or less, it is difficult to planarize the upper surface thereof, and when the insertion layer 130 is formed at a temperature of 1200° C. or more, it is difficult to grow the insertion layer 130.

The insertion layer 130 may have a thickness of 100 to 500 nm. The thickness of the insertion layer 130 may be varied depending on the height of the roughness of the upper surface of the first buffer layer 120. When the thickness of the insertion layer 130 is 100 nm or less, inhibition effect of the molecular diffusion can be reduced, and when the thickness is 500 nm or more, slimness of the light emitting device 100 is inhibited and light extraction can be reduced.

The insertion layer 130 may comprise aluminum gallium nitride ($Al_xGa_{1-x}N$, $0.1 \leq x \leq 0.4$). When x is 0.1 or less, the content of aluminum is not sufficient and the insertion layer 130 cannot sufficiently prevent diffusion of silicon particles into the light emitting structure 140, and when x is 0.4 or more, the thickness of the insertion layer 130 must be excessively increased to maintain the function of the insertion layer 140.

The second buffer layer 150 may be disposed on the insertion layer 130. The second buffer layer 150 may be disposed under the light emitting structure 140. The second buffer layer 150 can separate the insertion layer 130 from the light emitting structure 140. The second buffer layer 150 may be formed using aluminum nitride (AlN).

The second buffer layer 150 may be planarized. The second buffer layer 150 is disposed on the uniformly grown insertion layer 130 and the upper surface thereof is thus planarized. The second buffer layer 150 can reduce the difference in lattice coefficient with the light emitting structure 140.

The second buffer layer 150 can prevent molecular diffusion that may occur between the substrate 110 and the light emitting structure 150. The second buffer layer 150 can prevent molecular diffusion and thus inhibit meltback. The second buffer layer 150 reinforces functions of the first buffer layer 120 and the insertion layer 130. The second buffer layer 150 reduces difference in lattice coefficient with the light emitting structure 140, thus preventing delamination.

The second buffer layer 150 may be formed at 1200 to 1300° C. When the second buffer layer 150 is formed at 1200° C. or less, crystallinity of the aluminum nitride may be deteriorated and when the second buffer layer 150 is formed at 1300° C. or more, growth of layers may be difficult.

The second buffer layer 150 may have a thickness of 50 to 100 nm. When the second buffer layer 150 has a thickness of 50 nm or less, the effect of molecular diffusion prevention may be inhibited, and when the thickness is 100 nm or more, slimness of the light emitting device 100 may be deteriorated and the amount of light extraction can be reduced.

Figure 2A:
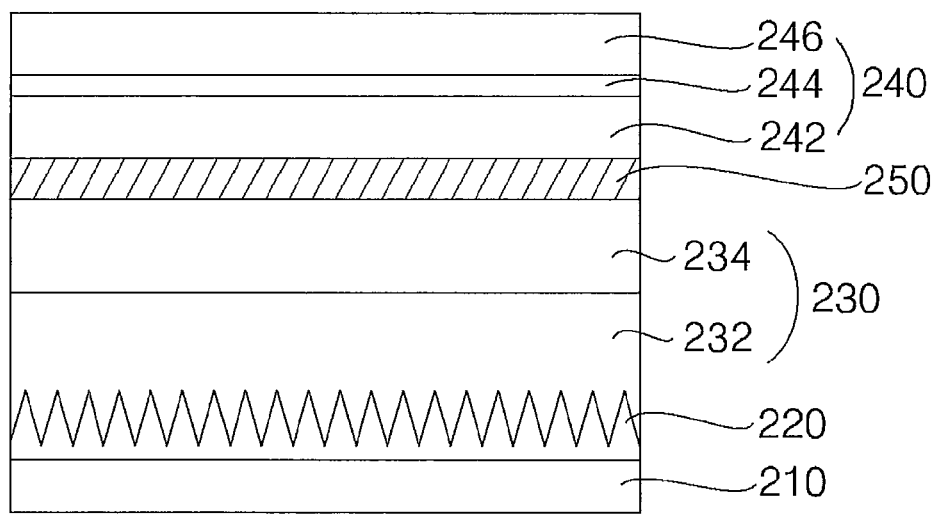
FIG. 2A is a sectional view illustrating the structure of a light emitting device according to one embodiment.
Figure 2B:
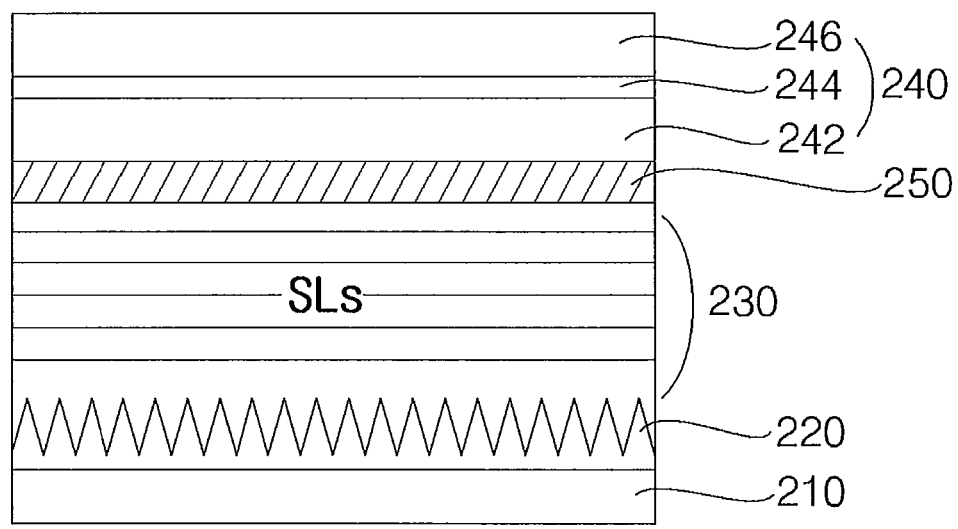
FIG. 2B is a sectional view illustrating the structure of a light emitting device according to one embodiment.

FIG. 2A is a sectional view illustrating a structure of a light emitting device according to one embodiment. FIG. 2B is a sectional view illustrating a structure of a light emitting device according to another embodiment.

Referring to FIGS. 2A and 2B, the light emitting device 200 may have an insertion layer 230 with a multilayer structure. The insertion layer 230 may include a first layer 232 and a second layer 234.

The insertion layer 230 has a multilayer structure, thereby preventing molecular diffusion in the light emitting device 200. The insertion layer 230 can reduce difference in lattice coefficient between the light emitting structure 240 and the substrate 210. The insertion layer 230 can reduce delamination between the light emitting structure 240 and the substrate 210.

The insertion layer 230 may include a first layer 232 and a second layer 234. The insertion layer 230 have a laminate structure comprising the first layer 232 and the second layer 234. The first layer 232 and the second layer 234 included in the insertion layer 230 may paired. A plurality of pairs of the first layer 232 and the second layer 234 in the insertion layer 230 may be laminated.

The first layer 232 may be paired with the second layer 234. The first layer 232 is paired with the second layer 234 to contribute a superlattice (SL). The first layer 232 may comprise aluminum (Al). In some embodiments, the first layer 232 may be made of one of aluminum gallium nitride ($Al_xGa_{1-x}N$, $0.1 \leq x \leq 0.4$), aluminum nitride (AlN), and aluminum gallium nitride ($Al_xGa_{1-x}N$, $0.3 \leq x \leq 0.4$).

The insertion layer 230 has a superlattice (SL) structure, thus serving as a buffer capable of protecting the light emitting device 200 from exterior shock. By making the upper surface of the insertion layer 230 even, crystallinity of the light emitting structure 240 disposed thereon the insertion layer 230 can be improved.

The second layer 234 may be paired with the first layer 232. In some embodiments, the second layer 234 may be made of one of gallium nitride (GaN), or aluminum gallium nitride ($Al_yGa_{1-y}N$, $0.05 \leq y \leq 0.1$).

In the insertion layer 230 according to one embodiment, when the first layer 232 is made of aluminum gallium nitride ($Al_xGa_{1-x}N$, $0.1 \leq x \leq 0.4$), the second layer 234 may be made of gallium nitride (GaN). When x of aluminum gallium nitride ($Al_xGa_{1-x}N$) is 0.1 or less, the content of aluminum is low and prevention effect of molecular diffusion may be deteriorated, and when x is 0.4 or more, the thickness of the first layer 232 should be increased in order to prevent molecular diffusion and slimness of the light emitting device 200 may be inhibited.

In the insertion layer 230 according to another embodiment, when the first layer 232 is made of aluminum nitride (AlN), the second layer 234 may be made of gallium nitride (GaN). The insertion layer 230 according to this embodiment has an even upper surface and molecular diffusion between the substrate 210 and the light emitting structure 240 can be prevented. In the insertion layer 230 according to another embodiment, when the first layer 232 is made of aluminum gallium nitride ($Al_xGa_{1-x}N$, $0.3 \leq x \leq 0.4$), the second layer 234 may be made of aluminum gallium nitride ($Al_yGa_{1-y}N$, $0.05 \leq y \leq 0.1$). In this embodiment, two layers having different aluminum contents are repeatedly laminated, thereby maximizing the effect of molecular diffusion prevention.

Referring to FIG. 2A, the first layer 232 and the second layer 234 of the insertion layer 230 may be paired. Referring to FIG. 2B, a plurality of pairs of the first layer 232 and the second layer 234 in the insertion layer 230 may be laminated to constitute a supperlattice structure.

In the insertion layer 230, one to five pairs of the first layer 232 and the second layer 234 may be laminated. At least one pair of the first layer 232 and the second layer 234 should be laminated in order to secure the insertion layer 230. When five or more pairs are laminated, the amount of light extraction may be deteriorated.

Pairs of the first layer 232 and the second layer 234 are laminated and the surface of the insertion layer 230 may be planarized. The insertion layer 230 can efficiently block diffusion of silicon (Si) particles from the substrate 210 to the light emitting structure 240.

Figure 3A:
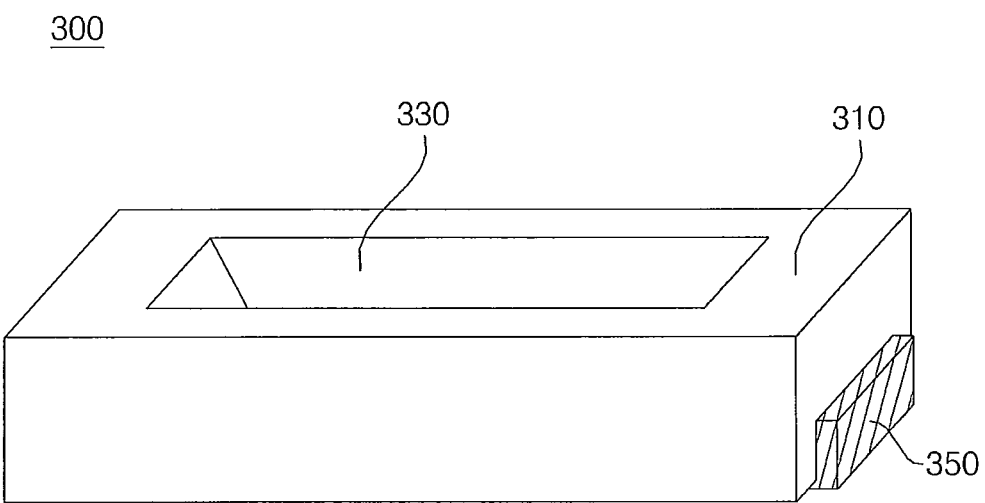
FIG. 3A is a perspective view illustrating a light emitting device package including the light emitting device according to one embodiment.
Figure 3B:
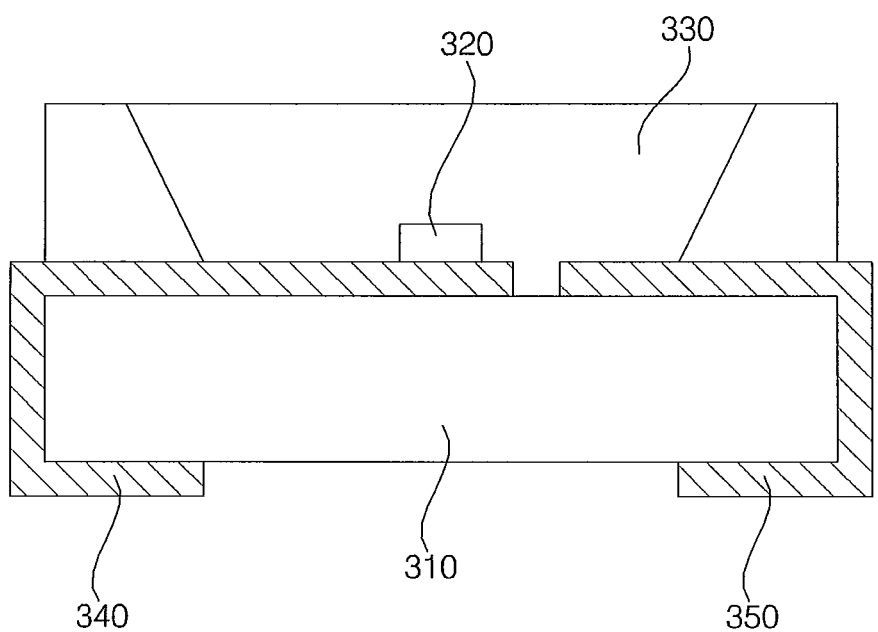
FIG. 3B is a sectional view illustrating a light emitting device package including the light emitting device according to one embodiment.

FIG. 3A is a perspective view illustrating a light emitting device package 300 according to one embodiment. FIG. 3B is a sectional view illustrating a light emitting device package 300 according to another embodiment.

Referring to FIGS. 3A and 3B, the light emitting device package 300 according this embodiment may include a body 310 forming a cavity, a first electrode layer 340 and a second electrode layer 350 mounted on the body 310, a light emitting device 320 electrically connected to the first electrode layer 340 and the second electrode layer 350, and a sealant 330 disposed in the cavity, and the sealant 330 may include a phosphor (not shown).

The body 310 may be made of at least one selected from resins such as polyphthalamide (PPA), silicon (Si), aluminum (Al), aluminum nitride (AlN), aluminum oxide (AlOx), photosensitive glass (PSG), polyamide 9T (PA9T), syndiotactic polystyrene (SPS), a metal, sapphire ($Al_2O_3$), beryllium oxide (BeO), ceramic, and a printed circuit board (PCB). In addition, the body 310 may be formed by injection molding, etching or the like, but the formation method is not limited thereto.

The inner surface of the body 310 may be provided with an inclined plane and, in particular, a reflection angle of light emitted from the light emitting device 320 may be varied depending on the angle of the inclined plane and as a result, an orientation angle of light emitted to the outside may be varied.

Meanwhile, as seen from the top, the cavity provided in the body 310 may have various shapes including, without being limited to, a circular shape, a rectangular shape, a polygonal shape, an oval shape and a shape with curved corners.

The sealant 330 may be filled in the cavity and the sealant 330 may include a phosphor (not shown). The sealant 330 may be made of transparent silicone, epoxy and other resins and may be formed by filling the cavity with a resin, followed by UV or heat curing.

The phosphor (not shown) is selected taking into consideration the wavelength of light emitted from the light emitting device 320 to allow the light emitting device package 300 to render white light.

Depending on the wavelength of light emitted from the light emitting device 320, the phosphor included in the sealant 330 may be at least one of blue light emitting phosphors, blue-green light emitting phosphors, green light emitting phosphors, yellow-green light emitting phosphors, yellow light emitting phosphors, yellow-red light emitting phosphors, orange light emitting phosphors, and red light emitting phosphors.

That is, the phosphor (now shown) is excited by first light emitted from the light emitting device 320 to produce second light. For example, in a case where the light emitting device 320 is a blue light emitting diode and the phosphor (not shown) is a yellow phosphor, the yellow phosphor is excited by blue light to emit yellow light, blue light emitted from the blue light emitting diode is mixed with yellow light excited and generated by blue light to allow the light emitting device package 200 to render white light.

Similarly, in the case where the light emitting device 320 is a green light emitting diode, a magenta phosphor or a combination of blue and red phosphors may be exemplified, and in the case where the light emitting device 320 is a red light emitting diode, a cyan phosphor or a combination of blue and green phosphors may be exemplified.

Such a phosphor may be a known phosphor such as YAG, TAG, sulfides, silicates, aluminates, nitrides, carbides, nitridosililcates, borates, fluorides and phosphates.

Meanwhile, the first electrode 340 and the second electrode 350 may be mounted on the body 310. The first electrode 340 and the second electrode 350 are electrically connected to the light emitting device 320 to supply electricity to the light emitting device 320.

The first electrode 340 and the second electrode 350 are electrically separated from each other, to reflect light emitted from the light emitting device 320 and thereby improve luminous efficacy. The first electrode 340 and the second electrode 350 discharge heat emitted from the light emitting device 320 to the outside.

FIG. 3B illustrates a case in which the light emitting device 320 is mounted on the first electrode 340, although the disclosure is not limited to this configuration. The light emitting device 320 may be electrically connected to the first electrode 340 and the second electrode 350 by wire bonding, flip chip or die bonding.

The first electrode 340 and the second electrode 350 may comprise a metal such as titanium (Ti), copper (Cu), nickel (Ni), gold (Au), chromium (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru), iron (Fe), and alloys thereof. In addition, the first and second electrodes 340 and 350 may have a monolayer or multilayer structure, without being limited thereto.

The light emitting device 320 is mounted on the first electrode 340 and examples thereof include, but are not limited to, light emitting devices emitting red, green, blue Or white light, and light emitting devices emitting ultraviolet light. Further, one or more light emitting devices 320 may be mounted.

Further, the light emitting device 320 may be applied to all of a horizontal light emitting device, in which all electrical terminals thereof are disposed on the upper surface, a vertical light emitting device, in which electrical terminals thereof are disposed on the upper or lower surface, and a flip chip light emitting device.

The light emitting device 320 may include an insertion layer (not shown). The light emitting device 320 is provided with an insertion layer (not shown) between the first buffer layer (not shown) and the light emitting structure (not shown), thus preventing molecular diffusion from the substrate (not shown) to the light emitting structure (not shown), planarizing the surface thereof and thereby improving reliability of the light emitting structure (not shown).

The light emitting device 320 includes the insertion layer (not shown), thereby maximizing reliability and the amount of light extraction of the light emitting device package 300.

The light emitting device package 300 according to one embodiment is arrayed in plural on the substrate and optical members such as the light guide plate, prism sheet and diffusion sheet may be arranged on a light passage of the light emitting device package 300.

The light emitting device package 300, the substrate and the optical members may serve as a light unit. In another embodiment, a display device, an indicating device and a lighting device including the light emitting device or light emitting device package disclosed in the afore-mentioned embodiments may be realized. For example, the lighting device may include a lamp, a streetlamp, or the like.

Figure 4A:
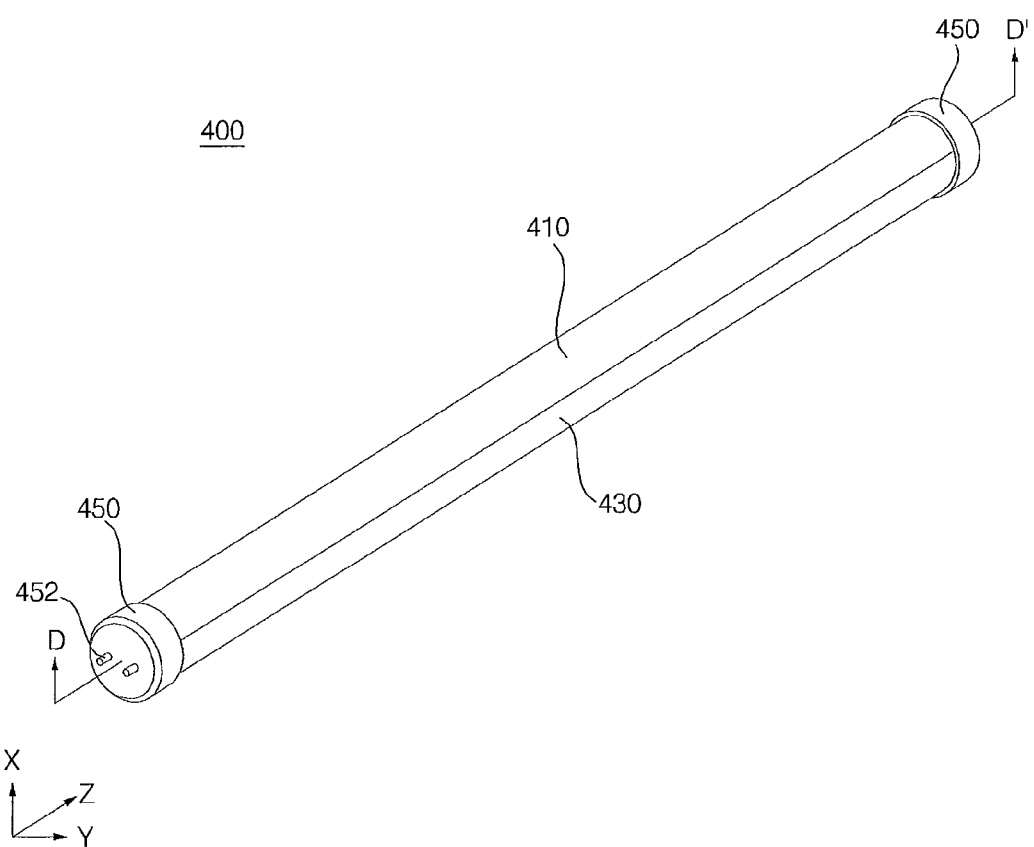
FIG. 4A is a perspective view illustrating a lighting device including a light emitting module according to one embodiment.
Figure 4B:
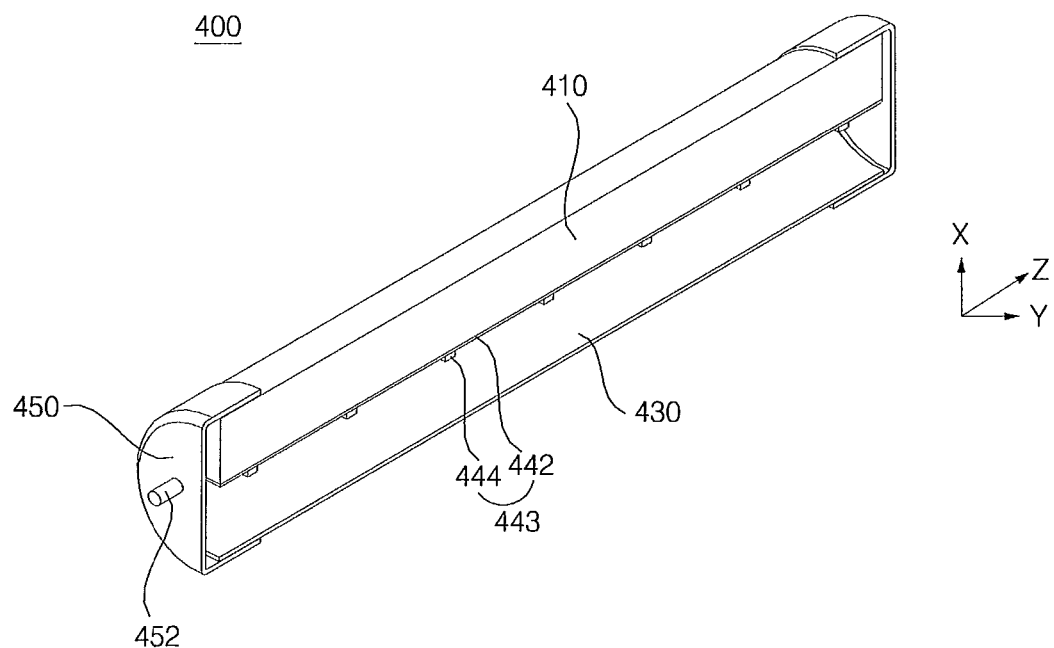
FIG. 4B is a sectional view illustrating a lighting device including a light emitting module according to one embodiment.

FIG. 4A is a perspective view illustrating a lighting device 400 including the light emitting device package according to one embodiment. FIG. 4B is a sectional view illustrating the cross-section of D-D' of the lighting system of FIG. 4A.

That is, FIG. 4B is a sectional view in which the lighting system of FIG. 4A is cut along a longitudinal direction (Z) and a height direction (X) and is seen from a horizontal direction (Y).

Referring to FIGS. 4A and 4B, the lighting system 400 may include a body 410, a cover 430 connected to the body 510 and an end cap 450 disposed at both ends of the body 410.

A light emitting device module 443 is coupled to the upper surface of the body 410 and the body 410 may be composed of a metal material which exhibits superior conductivity and heat dissipation effects in order to discharge heat generated from the light emitting device package 444 to the outside through the top of the body 410, without being limited thereto.

The light emitting device package 444 includes a light emitting device (not shown).

The light emitting device (not shown) includes an insertion layer (not shown). The light emitting device 320 is provided with an insertion layer (not shown) between the first buffer layer (not shown) and the light emitting structure (not shown), thus preventing molecular diffusion from the substrate (not shown) to the light emitting structure (not shown), planarizing the surface thereof and thereby improving reliability of the light emitting structure (not shown).

The light emitting device package 444 includes the light emitting device 320 including the insertion layer (not shown), thereby improving light extraction efficiency of the light emitting device package 444 and the lighting system 400 and further maximizing reliability of the lighting system 400.

The light emitting device packages 444 are mounted on the PCB 442 in multiple colors and multiple rows to constitute an array, and may be spaced from one another by a predetermined distance or by different distances, as necessary, to control brightness. The PCB 442 may be a metal core PCB (MPPCB) or PCB made of FR4.

The cover 430 may take the shape of a circle to surround the bottom of the body 410, without being limited thereto.

The cover 430 protects the light emitting device module 440 from foreign substances. In addition, the cover 430 includes diffusion particles to prevent glare generated from the light emitting device package 444 and to uniformly discharge light to the outside. In addition, a prism pattern or the like may be formed on at least one of the inner and outer surfaces of the cover 430. Alternatively, a phosphor may be applied to at least one of the inner and outer surfaces of the cover 430.

Meanwhile, the cover 430 should exhibit superior light transmittance, in order to discharge light generated from the light emitting device package 444 through the cover 430 to the outside, and the cover 430 should exhibit sufficient heat resistance in order to endure heat emitted by the light emitting device package 444. Preferably, the cover 430 is composed of a material including polyethylene terephthalate (PET), polycarbonate (PC), polymethyl methacrylate (PMMA) or the like.

The end cap 450 is disposed on both ends of the body 410 and may be used to seal a power supply device (not shown). In addition, the end cap 450 is provided with a power pin 452, allowing the lighting device 400 to be applied to a conventional terminal from which a fluorescent light has been removed, without using any additional device.

Figure 5:
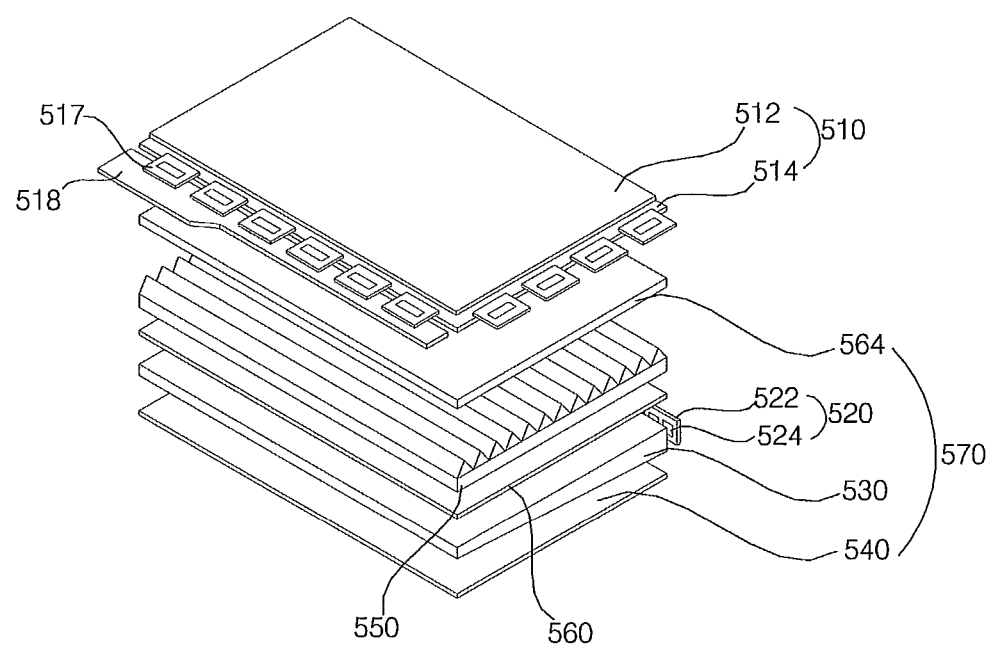
FIG. 5 is an exploded perspective view illustrating a backlight unit including a light emitting module according to one embodiment.

FIG. 5 is an exploded perspective view illustrating a liquid crystal display including the light emitting device according to one embodiment.

FIG. 5 illustrates an edge-light type liquid crystal display device 500 which includes a liquid crystal display panel 510 and a backlight unit 570 to supply light to the liquid crystal display panel 510.

The liquid crystal display panel 510 displays an image using light supplied from the backlight unit 570. The liquid crystal display panel 510 includes a color filter substrate 512 and a thin film transistor substrate 514 which face each other such that liquid crystal is interposed therebetween.

The color filter substrate 512 can realize color of images to be displayed through the liquid crystal display panel 510.

The thin film transistor substrate 514 is electrically connected to a printed circuit board 518 on which a plurality of circuit components are mounted through a driving film 517. In response to drive signals supplied from the printed circuit board 518, the thin film transistor substrate 514 may apply a drive voltage from the printed circuit board 518 to liquid crystals.

The thin film transistor substrate 514 includes a thin film transistor and a pixel electrode formed as a thin film on another substrate composed of a transparent material such as glass or plastic.

The backlight unit 570 includes a light emitting device module 520, a light guide plate 530 to convert light emitted from the light emitting device module 520 into surface light and supply the light to the liquid crystal display panel 510, a plurality of films 550, 566 and 564 to uniformize brightness of light from the light guide plate 530 and improve vertical incidence, and a reflective sheet 540 to reflect light emitted to the back of the light guide plate 530 to the light guide plate 530.

The light emitting device module 520 includes a plurality of light emitting device packages 524 and a PCB substrate 522 on which the light emitting device packages 524 are mounted to form an array.

The light emitting device package 524 includes a light emitting device (not shown). The light emitting device (not shown) includes an insertion layer (not shown). The light emitting device 320 is provided with an insertion layer (not shown) between the first buffer layer (not shown) and the light emitting structure (not shown), thus preventing molecular diffusion from the substrate (not shown) to the light emitting structure (not shown), planarizing the surface thereof and thereby improving reliability of the light emitting structure (not shown).

The light emitting device package 524 includes the light emitting device 320 including the insertion layer (not shown), thereby improving light extraction efficiency and further improving reliability of the backlight unit 570.

Meanwhile, the backlight unit 570 includes a diffusion film 566 to diffuse light incident from the light guide plate 530 toward the liquid crystal display panel 510, a prism film 550 to concentrate the diffused light and thus improve vertical incidence and a protective film 564 to protect the prism film 550.

Figure 6:
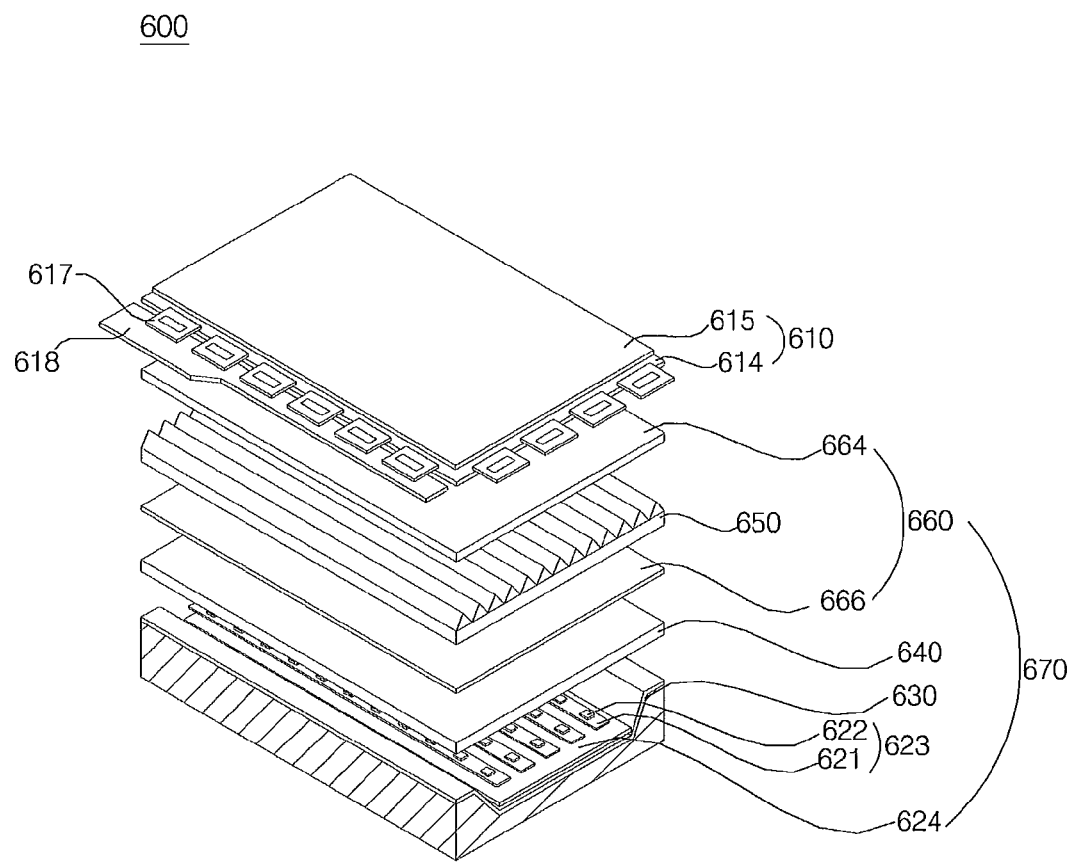
FIG. 6 is an exploded perspective view illustrating a backlight unit including the light emitting module according to one embodiment.

FIG. 6 is an exploded perspective view illustrating a liquid crystal display including the light emitting device according to one embodiment. The contents illustrated and described in FIG. 5 are not mentioned in detail.

FIG. 6 illustrates a direct-type liquid crystal display device 600. The liquid crystal display device 600 includes a liquid crystal display panel 610 and a backlight unit 670 to supply light to the liquid crystal display panel 610. The liquid crystal display panel 610 has been described with reference to FIG. 5 and a detailed explanation thereof is thus omitted.

The backlight unit 670 includes a plurality of light emitting device modules 623, a reflective sheet 624, a lower chassis 630 in which the light emitting device module 623 and the reflective sheet 624 are accepted, a diffusion plate 640 disposed on the light emitting device module 623, and a plurality of optical films 660.

The light emitting device module 623 includes a PCB 621 that enables a plurality of light emitting device packages 624 to be mounted and thereby to form an array.

The light emitting device package 622 includes a light emitting device (not shown). The light emitting device 320 is provided with an insertion layer (not shown) between the first buffer layer (not shown) and the light emitting structure (not shown), thus preventing molecular diffusion from the substrate (not shown) to the light emitting structure (not shown), planarizing the surface thereof and thereby securing reliability of the light emitting structure (not shown).

By using the light emitting device 320 including the insertion layer (not shown), it is possible to improve light extraction efficiency of the backlight unit 670 and further maximizing reliability of the backlight unit 670.

The reflective sheet 624 reflects light generated by the light emitting device package 622 toward the liquid crystal display panel 610 to improve luminous efficacy.

Meanwhile, light emitted from the light emitting device module 623 is incident on the diffusion plate 640 and an optical film 660 is disposed on the diffusion plate 640. The optical film 660 includes a diffusion film 666, a prism film 650 and a protective film 664.

The light emitting device according to embodiments includes an insertion layer comprising aluminum gallium nitride, disposed on the buffer layer on the substrate, thereby planarizing the interface between the light emitting structure and the buffer layer.

The light emitting device according to embodiments includes an insertion layer, thereby preventing diffusion of silicon (Si) or gallium (Ga).

The light emitting device according to embodiments includes an insertion layer, thereby reducing difference in lattice coefficient between the light emitting structure and the buffer layer.

The light emitting device according to embodiments includes an insertion layer having a superlattice structure, thereby preventing molecular diffusion between the substrate and the light emitting structure.

In addition, the light emitting device according to the embodiments may be applied without limitation of configuration and method of the embodiments mentioned above and may be configured in a selective combination of the entirety or part of respective embodiments.

Although embodiments have been described with reference to a number of illustrative embodiments thereof, it should be understood that numerous other modifications and applications may be devised by those skilled in the art that will fall within the intrinsic aspects of the embodiments. More particularly, various variations and modifications are possible in concrete constituent elements of the embodiments. In addition, it is to be understood that differences relevant to the variations and modifications fall within the spirit and scope of the present disclosure defined in the appended claims.

What is claimed is:

1. A light emitting device comprising:
a substrate;
a first buffer layer disposed on the substrate, the first buffer layer comprising aluminum nitride (AlN);
an insertion layer disposed on the first buffer layer, the insertion layer comprising aluminum (Al);
a light emitting structure disposed on the insertion layer, the light emitting structure comprising a first semiconductor layer, a second semiconductor layer, and an active layer interposed between the first semiconductor layer and the second semiconductor layer; and
a second buffer layer that is interposed between the insertion layer and the light emitting structure and comprising aluminum nitride (AlN),
wherein the insertion layer comprises at least one first layer and at least one second layer, and
wherein the first layer contains aluminum gallium nitride ($Al_xGa_{1-x}N$, $0.3 \leq x \leq 0.4$), and the second layer comprises aluminum gallium nitride ($Al_yGa_{1-y}N$, $0.05 \leq y \leq 0.1$).

2. The light emitting device according to claim 1, wherein the insertion layer is formed by repeatedly laminating the first layer and the second layer.

3. The light emitting device according to claim 1, wherein the insertion layer is formed by laminating one to five pairs of the first layer and the second layer.

4. The light emitting device according to claim 1, wherein the insertion layer is formed at 1000 to 1200° C.

5. The light emitting device according to claim 1, wherein the second buffer layer is formed at 1200 to 1300° C.

6. The light emitting device according to claim 1, wherein the interface between the first buffer layer and the insertion layer is provided with roughness.

7. The light emitting device according to claim 1, wherein the insertion layer has a thickness of 100 to 500 nm.

8. The light emitting device according to claim 1, wherein the first buffer layer has a thickness of 30 to 50 nm.

9. The light emitting device according to claim 1, wherein the second buffer layer has a thickness of 50 to 100 nm.

10. The light emitting device according to claim 1, wherein the substrate comprises silicon (Si).

11. A light emitting device comprising:
a substrate;
a first buffer layer disposed on the substrate, the first buffer layer comprising aluminum nitride (AlN);
an insertion layer disposed on the first buffer layer, the insertion layer comprising a plurality of first layers comprising aluminum (Al) and a plurality of second layers comprising aluminum (Al) in an amount different from the amount of aluminum comprised in the first layer;
a light emitting structure disposed on the insertion layer, the light emitting structure comprising a first semiconductor layer, a second semiconductor layer, and an active layer interposed between the first semiconductor layer and the second semiconductor layer; and a second buffer layer that is interposed between the insertion layer and the light emitting structure and comprising aluminum nitride (AlN), and wherein the first layer contains aluminum gallium nitride ($Al_xGa_{1-x}N$, $0.3 \leq x \leq 0.4$), and the second layer comprises aluminum gallium nitride ($Al_yGa_{1-y}N$, $0.05 \leq y \leq 0.1$).

12. A light emitting device package comprising:
a light emitting device according to claim 1;
a lead frame electrically connected to the light emitting device; and
a body in which the lead frame and the light emitting device are mounted.

* * * * *